US012665157B2

(12) United States Patent
Henstra et al.

(10) Patent No.: US 12,665,157 B2
(45) Date of Patent: Jun. 23, 2026

(54) TECHNIQUES FOR NARROWING ZERO LOSS PEAKS IN MONOCHROMATED CHARGED PARTICLES SOURCES

(71) Applicant: FEI Company, Hillsboro, OR (US)

(72) Inventors: Alexander Henstra, Eindhoven (NL); Ali Mohammadi-Gheidari, Eindhoven (NL)

(73) Assignee: FEI COMPANY

( * ) Notice: Subject to any disclaimer, the term of this patent is extended or adjusted under 35 U.S.C. 154(b) by 358 days.

(21) Appl. No.: 18/409,499

(22) Filed: Jan. 10, 2024

(65) Prior Publication Data

US 2024/0249905 A1     Jul. 25, 2024

Related U.S. Application Data

(60) Provisional application No. 63/480,868, filed on Jan. 20, 2023.

(51) Int. Cl.
H01J 37/04     (2006.01)
H01J 37/26     (2006.01)

(52) U.S. Cl.
CPC ............ H01J 37/04 (2013.01); H01J 37/261 (2013.01)

(58) Field of Classification Search
CPC ................................ H01J 37/04; H01J 37/261
See application file for complete search history.

(56) References Cited

U.S. PATENT DOCUMENTS

2015/0340200 A1* 11/2015 Jiang ....................... H01J 37/26
250/307
2015/0340201 A1* 11/2015 Wu .......................... H01J 37/04
250/307

OTHER PUBLICATIONS

Bronsgeest et al. "Probe current, probe size, and the practical brightness for probe forming systems", Journal of Vacuum Science & Technology B: Microelectronics and Nanometer Structures Processing, Measurement, and Phenomena, vol. 26, No. 949, 2008.
Mankos et al. "Novel electron monochromator for high resolution imaging and spectroscopy" Journal of Vacuum Science & Technology B, Nanotechnology & Microelectronics, vol. 34, No. 6, 2016.

* cited by examiner

*Primary Examiner* — Nicole M Ippolito
(74) *Attorney, Agent, or Firm* — Leron Vandsburger

(57)     ABSTRACT
Charged particle optical devices, systems, and methods are provided. A charged particle optical device can include a dispersing element disposed substantially on a beam axis, the dispersing element being configured to disperse particles of a beam of charged particles by energy in a dispersal plane parallel with the beam axis. The charged particle optical device can include a selector, disposed on the beam axis at a position substantially corresponding to a first crossover plane. The charged particle optical device can include an undispersing element. The charged particle optical device can include a cutoff disposed on the beam axis downstream of the selector at a position substantially corresponding to a second crossover plane on the beam axis. The second crossover plane can be downstream of the first crossover plane. The cutoff can include a material that is opaque to electrons and defining an aperture substantially aligned with the beam axis.

20 Claims, 8 Drawing Sheets

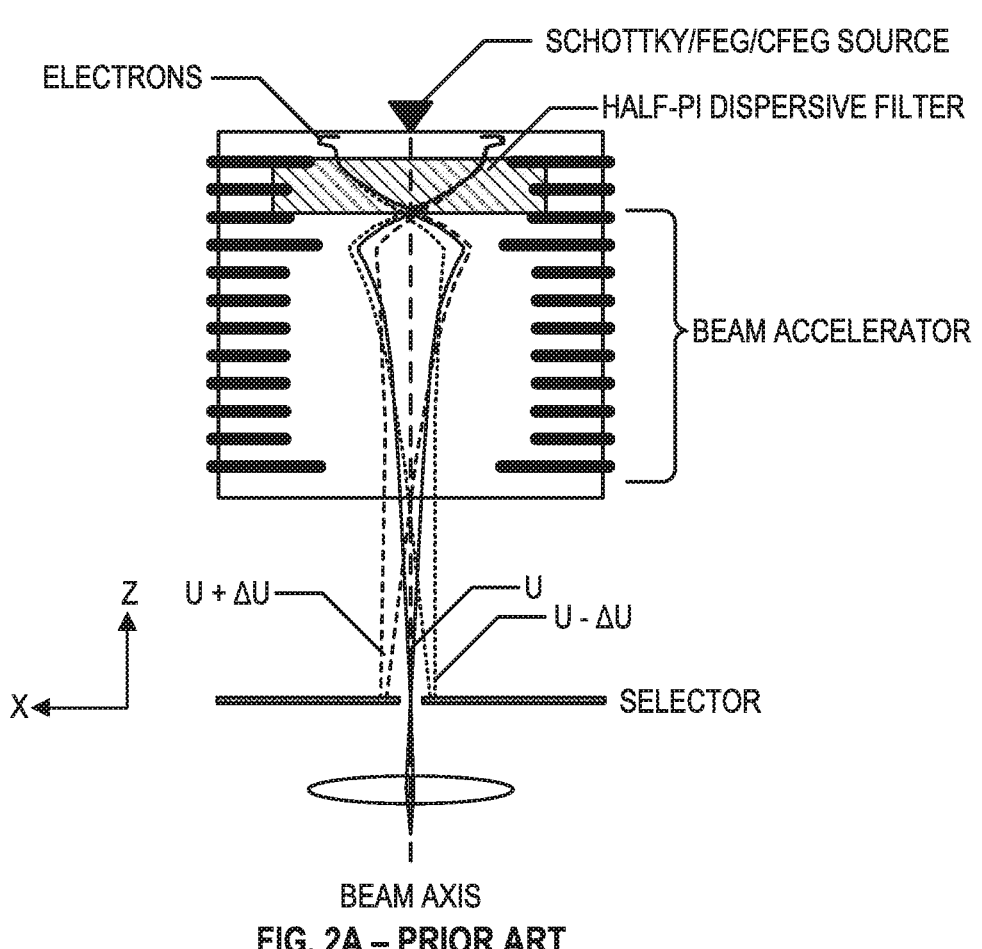
FIG. 2A – PRIOR ART
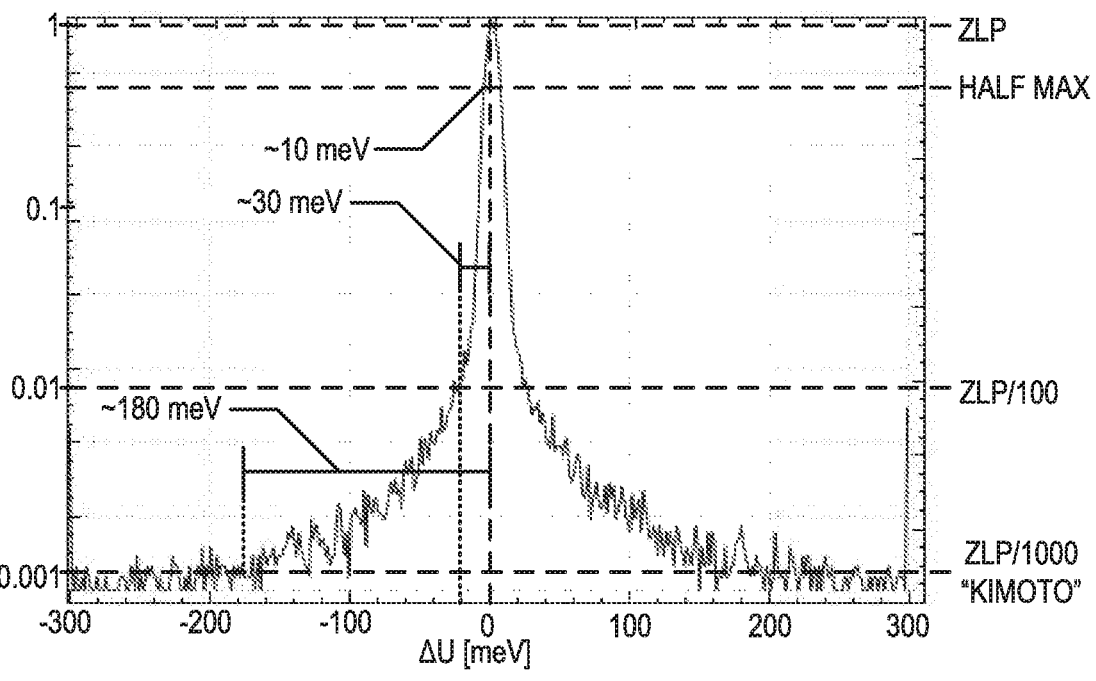
FIG. 2B – PRIOR ART

455

500

505

GENERATE BEAM OF CHARGED PARTICLES

510

SELECT SUBSET OF CHARGED PARTICLES

515

NARROW THE ENERGY DISTRIBUTION OF THE MONOCHROMATED BEAM

520

OUTPUT THE MONOCHROMATED BEAM

TECHNIQUES FOR NARROWING ZERO LOSS PEAKS IN MONOCHROMATED CHARGED PARTICLES SOURCES

CROSS-REFERENCE TO RELATED APPLICATIONS

This application claims the benefit of the filing date of U.S. Provisional Application Ser. 63/480,868 filed on Jan. 20, 2023, the disclosure of which is incorporated herein by reference in its entirety.

TECHNICAL FIELD

Embodiments of the present disclosure are directed to charged particle microscopy components, systems, and methods. In particular, some embodiments are directed toward monochromated electron sources.

BACKGROUND

Charged particle microscopy and microanalysis includes exposure of materials to a beam of electrons. Interaction between electrons and the sample generates different types of detectable signals that can be used for imaging and analysis. In transmission electron microscopes (TEMs), detailed information can be developed at the atomic scale, including images of the atomic and molecular structures of nanomaterials and crystalline materials.

TEM analysis of materials at progressively smaller length scales, such as those on the order of Angstroms to tens of Angstroms, includes loss spectroscopy techniques, such as electron energy loss spectroscopy (EELS). EELS depends in part on narrowly defined beam energy distributions, described in reference to the width of a zero-loss peak. As such, there is a need to develop components, systems, and methods for improved zero-loss peak width, for example, in the field of energy loss spectroscopy.

SUMMARY

In an aspect, a charged particle optical device can include a dispersing element disposed substantially on a beam axis, the dispersing element being configured to disperse particles of a beam of charged particles by energy in a dispersal plane parallel with the beam axis. The charged particle optical device can include a selector, disposed on the beam axis at a position substantially corresponding to a first crossover plane. The charged particle optical device can include an undispersing element. The undispersing element can be configured to at least partially undisperse particles of the beam of charged particles by energy in the dispersal plane. The charged particle optical device can include a cutoff disposed on the beam axis downstream of the selector at a position substantially corresponding to a second crossover plane on the beam axis. The second crossover plane can be downstream of the first crossover plane. The cutoff can include a material that is opaque to electrons and defining an aperture substantially aligned with the beam axis.

The charged particle optical device can be configured to output a beam of charged particles having an energy deviation from a target energy of less than or equal to about 80 meV at the $1/1000$ limit, where the $1/1000$ limit corresponds to a value of the energy distribution of the beam of electrons that is 1000 times smaller than a peak of the energy distribution at the target energy. The cutoff can define the aperture using a double knife edge or a slit. The aperture can be characterized by a width of about 200 nm to about 700 nm in a direction transverse to the beam axis at the crossover point. The aperture can be characterized by a width of about 300 nm in a direction transverse to the beam axis at the crossover point. A plurality of crossover planes can be defined on the beam axis downstream of the undispersing element. The second crossover can be nearest to the undispersing element of the plurality of crossover planes. A third crossover plane can be defined on the beam axis between the undispersing element and the second crossover plane. The beam of electrons can be a line focused beam or a point focused beam, or other forms.

The dispersing element can include a first Wien filter and a second Wien filter downstream of the first Wien filter. The selector can include a slit disposed on or near the beam axis between the first Wien filter and the second Wien filter. The dispersing element, the selector, and the undispersing element can together form at least a part of a fully undispersing monochromator. The charged particle optical device can further include one or more electron lenses, disposed on the beam axis downstream of the selector and configured to converge the beam of electrons onto the beam axis at the crossover plane, the second crossover plane, or the third crossover plane.

The energy deviation can be about 50 meV at the $1/1000$ limit. The energy deviation can be about 25 meV at the $1/1000$ limit. The energy deviation can be about 15 meV at the $1/1000$ limit. The first Wien filter is a Pi dispersing element and the second Wien filter can be Pi undispersing elements. The first Wien filter can be a half-Pi dispersing element. The second Wien filter can be a half-Pi undispersing element. The beam axis can be curved. The beam axis can be curved within the monochromator. The monochromator can be a mirror monochromator or an $\Omega$-type monochromator. The one or more lenses can include an electromagnetic lens or an electrostatic lens. The one or more lenses can include an electrostatic accelerating section or an electrostatic decelerating section. The charged particle optical device can further include an undispersing element disposed downstream of one or more lenses of the one or more lenses and upstream of the crossover plane.

In one aspect, a transmission electron microscope can include an electron source. The electron source can be configured to generate a beam of electrons substantially aligned along a beam axis. The transmission electron microscope can include a monochromator disposed on the beam axis. The monochromator can include a dispersing element disposed on the beam axis. The dispersing element can be configured to disperse particles of a beam of charged particles by energy in a dispersal plane parallel with the beam axis. The monochromator can include a selector, disposed on the beam axis at a position substantially corresponding to a first crossover plane. The monochromator can include an undispersing element. The undispersing element ican be configured to at least partially undisperse particles of the beam of charged particles by energy in the dispersal plane. The transmission electron microscope can include a cutoff disposed on the beam axis downstream of the undispersing element at a position substantially corresponding to a second crossover plane on the beam axis. The cutoff can include a material that is opaque to electrons and can define an aperture aligned with the beam axis.

The charged particle optical device is configured to output a beam of electrons having an energy deviation from a target energy of less than or equal to about 80 meV at the $1/1000$ limit.

The transmission electron microscope can further include an electron optical element disposed on the beam axis between the electron source and the monochromator. The electron optical element can include an electromagnetic lens or an electrostatic lens. The electron optical element can include an accelerating element or a decelerating element. The electron optical element can be configured to focus the beam toward the beam axis. The monochromator and the undispersing element can together form at least part of a fully undispersing double-Wien filter.

The electron optical element can be configured to output a substantially parallel or diverging beam toward the beam axis. The monochromator and the undispersing element can together form at least part of a half-pi-half-pi double-Wien filter. The transmission electron microscope can be configured to selectively transmit a beam of electrons including a current of electrons from about 1 nA to about 100 nA and a target energy at the sample from about 10 keV to about 1500 keV.

In one or more aspects, a method of generating a monochromatic beam of charged particles can include generating a beam of electrons substantially aligned along a beam axis. The beam of electrons can include electrons having respective energies including a target energy. The method can include selecting a subset of electrons of the beam of electrons using a monochromator disposed on the beam axis. The subset of electrons can include a monochromated beam having an energy distribution about the target energy. The method can include narrowing the energy distribution of the monochromated beam using a cutoff, the cutoff being disposed on the beam axis downstream of the monochromator at a position substantially corresponding to a crossover plane of the monochromated beam on the beam axis. The cutoff can include a material that is opaque to electrons and defining an aperture aligned with the beam axis. The method can also include outputting the monochromated beam from the cutoff downstream of the cutoff.

In an aspect, one or more non-transitory computer-readable storage media, storing instructions that, when executed by one or more machines, causes the machine(s) to perform operations of the method of the preceding aspect.

The terms and expressions which have been employed are used as terms of description and not of limitation, and there is no intention in the use of such terms and expressions of excluding any equivalents of the features shown and described or portions thereof, but it is recognized that various modifications are possible within the scope of the claimed subject matter. Thus, it should be understood that although the present claimed subject matter has been specifically disclosed by embodiments and optional features, modification and variation of the concepts herein disclosed can be resorted to by those skilled in the art, and that such modifications and variations are considered to be within the scope of this disclosure as defined by the appended claims.

BRIEF DESCRIPTION OF THE DRAWINGS

The foregoing aspects and many of the attendant advantages of the present disclosure will become more readily appreciated as the same become better understood by reference to the following detailed description, when taken in conjunction with the accompanying drawings.

FIG. 2A is a schematic diagram illustrating an example monochromated electron source configured for use in a transmission electron microscope (TEM) system, in accordance with the current art.

FIG. 2B is an example zero-loss peak graph simulated for the electron source of FIG. 2A, in accordance with the current art.

Figure 1:
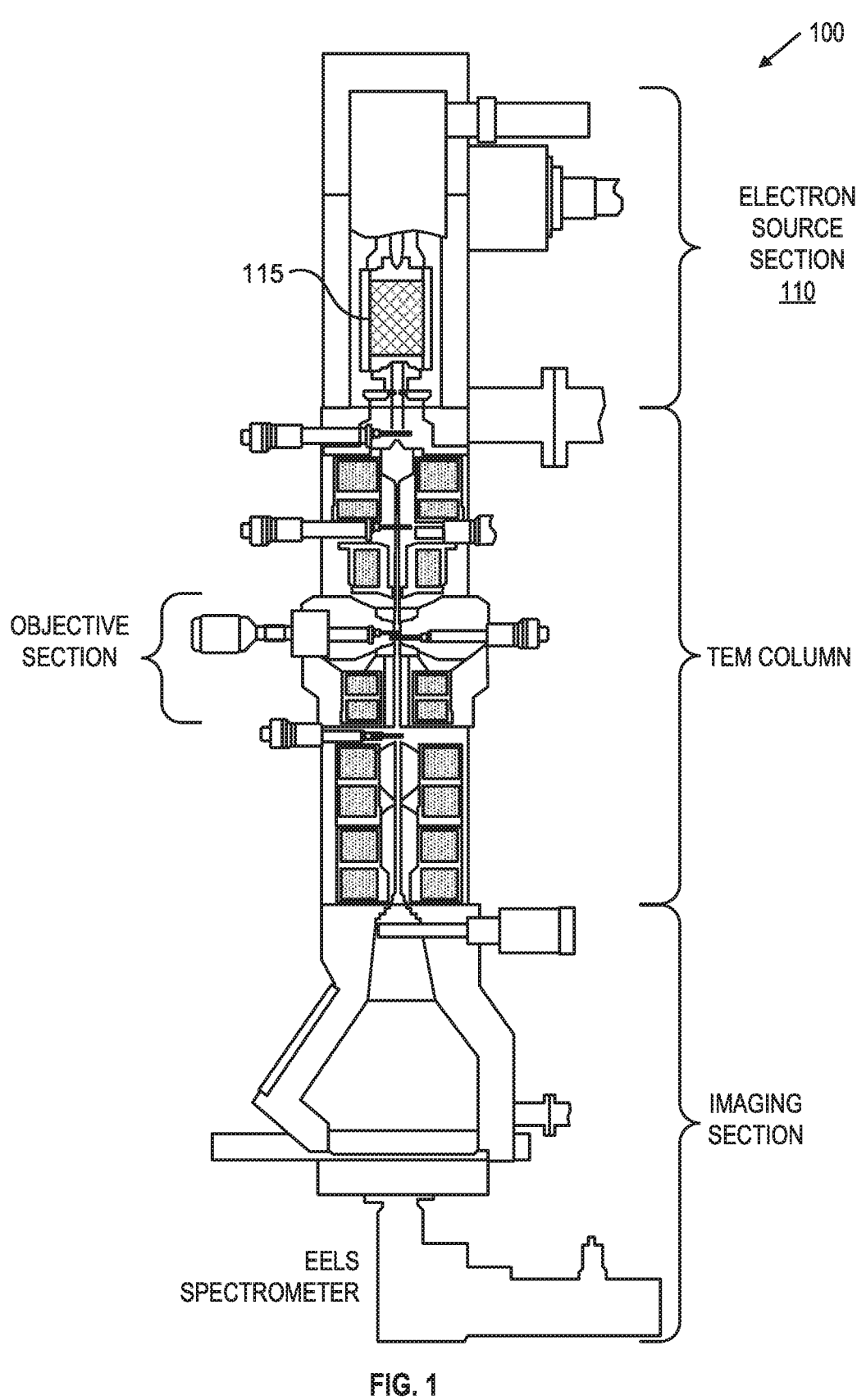
FIG. 1 is a schematic diagram illustrating a transmission electron microscope (TEM) system, in accordance with some embodiments of the present disclosure.

In the drawings, like reference numerals refer to like parts throughout the various views unless otherwise specified. Not all instances of an element are necessarily labeled to reduce clutter in the drawings where appropriate. The drawings are not necessarily to scale, emphasis instead being placed upon illustrating the principles being described.

DETAILED DESCRIPTION

While illustrative embodiments have been illustrated and described, it will be appreciated that various changes can be made therein without departing from the spirit and scope of the disclosure. In the forthcoming paragraphs, embodiments of a charged particle microscope system, components, and methods for improving zero-loss peak width are provided. Embodiments of the present disclosure include a transmission electron microscope incorporating an improved electron optical devices. The improved electron source can include a fully undispersing, partly undispersing, or dispersing monochromator, or a monochromator in which dispersion is undone fully, partly, negligibly, or not at all, configured to narrow an energy distribution of a monochromated beam of electrons having an energy distributed about a target energy. The electron optical device can include a cutoff disposed on a beam axis downstream of the monochromator at a position corresponding to a crossover plane on the beam axis. The cutoff can include a material that is opaque to electrons and can define an aperture that is substantially aligned with the beam axis, as described in more detail in reference to FIGS. 3A-3D. The cutoff can define an aperture, such as a circular aperture, a slit, a knife edge, a double knife edge, or the like.

Energy loss spectroscopy, such as Electron Energy Loss Spectroscopy (EELS), is a microanalysis technique that measures inelastic scattering of electrons transmitted through a sample. Inelastic scattering includes energy transfer between the electrons and the sample, which can be measured using a spectrometer configured to generate an energy loss spectrum for electrons transmitted through the sample. Through analysis of the energy loss spectrum, detailed material information (e.g., bonding arrangements, elemental composition, etc.) can be developed, including for samples of light elements that are otherwise challenging to analyze.

Electrons that pass through the sample without inelastic scattering (e.g., having lost little or no energy to the sample) form a zero-loss peak, or "ZLP," in the energy loss spectrum. The width of the zero-loss peak mainly reflects the energy distribution of the electron source. It is typically from about 0.2 eV to 2.0 eV, but can be narrower in a monochromated source. Information from valence electrons, such as plasmon resonance and interband transitions, can be derived from energy loss spectral information typically within about 50 eV of the zero loss peak. Information from inner-shell electrons, such as inner-shell ionization, can be derived from information typically beyond 100 eV from the zero loss peak.

Valence electron information is used in microanalysis of light elements, organic materials, and/or molecular samples for which detailed bonding information is sought. Such techniques are referred to as "vibrational EELS" that probe stretching, bending, scissoring, and other atomic and molecular bond transitions appearing in the energy loss spectrum within about 0.05 eV to about 1 eV of the zero loss peak. In this way, the width of the zero loss peak becomes a limiting factor for vibrational EELS, due at least in part to the background attributable to the zero loss peak. The width of the zero loss peak at the "1/1000 limit," as described in more detail in reference to FIG. 2B, is a metric (among other metrics including full width at half maximum, or FWHM) used to describe the energy distribution of a monochromated electron source. The 1/1000 limit corresponds to a value of the energy distribution of the beam of electrons that is 1000 times smaller than a peak of the zero loss peak (e.g., at a loss of 0 eV).

Improvements to the width of a zero loss peak at the 1/1000 limit can be based at least in part on attenuating the effect of coulombic interactions or other particle-particle energy transfer in a beam of charged particles that occur upstream of a selection plane. Narrowing the distribution of energies of charged particles emitted by a source can also improve performance (e.g., signal-to-noise and/or signal-to-background characteristics) of a charged particle spectroscopy system. In an illustrative example, via a combination of operating parameters of the source, the monochromator, and additional and/or alternative optical elements, charged particle optical devices of the present disclosure can be configured to output a beam of electrons having an energy deviation from a target energy of less than or equal to about 80 meV at the 1/1000 limit.

Typical approaches for generating chromatic electron beams for vibrational EELS include using alpha-type monochromators or omega-type monochromators making use of curved electron beam paths and multiple electromagnetic prisms that are structurally and operationally complex. Such sources typically exhibit a width of greater than 80 meV at the 1/1000 limit (e.g., 86 meV for an α-type monochromator, although the width can be smaller at the expense of probe current, with significant implications for EELS performance). In this context, the "width" of the zero loss peak refers to a half-width, measured from a center of the zero loss peak to the edge of the zero loss peak. It is noted that quoted resolution values in publications for charged particle monochromators can be lower than 80 meV (e.g., quoted at about 10 meV for some α-type monochromators), but such values typically reference the half-width at half-maximum (HWHM) of the zero loss peak, rather than the width measured at the 1/1000 limit (making the full-width at half-maximum (FWHM) about 20 meV, where the FWHM is typically quoted for the ZLP width). There is a need, therefore, for monochromated charged particle sources characterized by a zero loss peak half-width less than or equal to about 80 eV at the 1/1000 limit. Advantageously, embodiments of the present disclosure include electron optical systems and/or other charged particle systems configured to generate monochromated beams suitable for vibrational EELS (e.g., having a width of less than or equal to about 80 meV at the 1/1000 limit). Further, embodiments of the present disclosure are structurally and operationally less complex than the typical α-type monochromators employed for vibrational EELs, for example by attenuating ZLP tails downstream of a monochromator.

FIG. 1 is a schematic diagram illustrating a transmission electron microscope (TEM) system 100, in accordance with some embodiments of the present disclosure. In the following description, details of internal components and functions of the example TEM system 100 are omitted for simplicity and to focus description on embodiments of the present disclosure, as described in more detail in reference to FIGS. 3A-5, in contrast to typical systems described in FIG. 2A and FIG. 2B, and on techniques for augmenting the energy-resolution of monochromated beams of charged particles. The example TEM system 100 includes an electron source section 110, a TEM column including an objective section, and an imaging section. The present disclosure focuses on the electron gun section 110. In brief, the electron source section 110 includes electronics configured to energize an electron source, which can include a high-voltage field-emission source or other sources of emitted electrons, such that a beam of electrons is formed and conducted through a vacuum into the TEM column.

The TEM column includes components for beam forming, including electromagnetic lenses and electrostatic lenses and multiple apertures to control properties of the beam of electrons. TEM column components include condenser lenses, objective lenses, projector lenses, among others, as well as corresponding apertures. The imaging section includes one or more type of detector, sensor, screen, and/or optics configured to generate images, spectra, and other data for use in sample imaging and/or microanalysis. For example, the imaging section can include a scintillator screen, binoculars, transmission electron microscopy (TEM) detector(s) (e.g., pixelated electron detector, secondary electron detector, camera(s), and electron energy loss spectroscopy (EELS) spectrometers, among others.

As described in more detail in reference to FIGS. 3A-5, TEM system 100 can include a charged particle optical device 115. The charged particle optical device 115 can include one or more monochromators, one or more electromagnetic lenses, one or more electrostatic lenses, one or more charged particle accelerator elements, one or more charged particle decelerator elements, and/or one or more apertures and/or slits that block and/or attenuate part of the beam of electrons (e.g., a foil defining a slit or aperture can be of suitable thickness such that some electrons can still penetrate the foil with a scatter angle and/or energy loss that don't disturb the resulting EELS spectrum). The configuration of constituent elements of the charged particle optical device 115 permits the example TEM system 100 to generate a monochromated beam of electrons characterized by an improved (e.g., relatively narrow) energy resolution, as measured at the $\frac{1}{1000}$ limit of the zero loss peak, or "ZLP," as compared to existing systems that are more structurally and operationally complex. Further, the charged particle optical device 115 permits the example TEM system 100 to perform vibrational EELS at a relatively higher current, above 10 pA, than what is currently available with comparable optical devices, without including more complex alpha-type monochromators, as described in more detail in reference to FIG. 2A and FIG. 2B.

FIG. 2A is a schematic diagram illustrating an example dispersing monochromated electron source configured for use in a transmission electron microscope (TEM) system, in accordance with the current art. A beam of electrons is generated by a source, such as a thermionic Schottky source, a field emission (FEG) source (e.g., a Schottky-FEG source or a cold FEG (CFEG) source), among others. The outer extents of the beam are shown to simplify the diagram and to focus description on the dispersing elements downstream of the source, but it is understood that electrons are also emitted between the lines illustrated. In the dispersing monochromator shown, the beam of electrons is passed through a half-pi Wien filter configured to spatially disperse the electrons by energy in a dispersal plane parallel to the beam axis (e.g., the "x-z" plane). The half-pi Wien filter shown is an example of a "double focusing" Wien filter, which focuses in the XZ plane shown and the orthogonal YZ plane (not shown).

A selector is disposed downstream of the monochromator to selectively block portions of the electron beam that have an energy different from a target energy ("U"). In the source of FIG. 2A, the selector is disposed in a focal plane, where each individual energy is focused in the dispersive direction (X), and can also be focused in the non-dispersive direction (Y), at a point which depends on the electron energy. Due at least in part on the dispersal of the beam of electrons, the selector can selectively block electrons having an energy that deviates from the target energy ("U±ΔU") beyond a given tolerance, where "ΔU" refers to a deviation from the target energy. Placing the selector at a crossover plane on the beam axis where the electron beam is dispersed improves the energy resolution of the monochromator at the expense of a lower beam current after the selector. Reduced beam current is a disadvantage of the configuration of FIG. 2A with respect to vibrational EELS. The relative prominence of noise in the region of the zero loss peak where vibrational EELS information is found increases with decreasing beam current. As such, signal-to-noise and signal-to-background become significant factors affecting data analysis of vibrational EELS spectra collected using the monochromator of FIG. 2A.

FIG. 2B is an example zero-loss peak (ZLP) graph simulated for the electron source of FIG. 2A, in accordance with the current art. The graph of FIG. 2B is provided to describe superior properties of some embodiments of the present disclosure that are shared with the prior art. To that end, concepts and spectral features are discussed that are later referenced in FIGS. 3A-5. The graph of FIG. 2B includes a data series showing a value of the zero loss peak (ordinate, log scale) plotted against a differential energy deviation "ΔU," (abscissa, linear scale) relative to a target energy normalized to zero (slight asymmetry is visible about the vertical axis). For simplicity of explanation, the log scale of the zero loss peak value is normalized to a value of one at the peak value corresponding to the target energy. The performance of the monochromator of FIG. 2A does not correspond to the current benchmark ZLP width for EELS, which is generated by alpha-type monochromators, as described previously, which are more complex to operate.

In EELS the width of the ZLP at the half-maximum (FWHM or HWHM) is a meaningful indicator of the suitability of the monochromator. Various peak fitting techniques can be applied to determining the width values, based at least in part on a peak shape that is typically slightly asymmetric and biased toward positive differential energies. As vibrational information is found within 300 meV of the ZLP peak position (the origin of the ZLP), and is typically at low intensity relative to the ZLP background, the width of the ZLP at two orders of magnitude and/or at three orders of magnitude less than the maximum intensity of the ZLP (intensity=1 in FIG. 2B) become meaningful parameters for vibrational EELS. The ZLP/1000 intensity is referred to as the "$\frac{1}{1000}$ limit."

The half-width of the ZLP at the $\frac{1}{1000}$ limit is a current benchmark for suitability of a monochromated charged particle source for vibrational EELS. As shown in FIG. 2B, the half-width at the ZLP/1000 is significantly larger than the half-width at ZLP/100. Without being bound to a particular physical mechanism, it is understood that the shape of the ZLP between ZLP/100 and ZLP/1000 is influenced by particle-particle interactions in the beam upstream of the selector (e.g., coulombic interactions in the case of an electron beam). The configuration of components in the monochromator of FIG. 2A is not addressed at repairing the energetic dispersion of such interactions. As a result, the width of the ZLP at the $\frac{1}{1000}$ limit for the monochromator of FIG. 2A is about 180 meV. The current benchmark for vibrational EELS is approximately 86 meV, provided by a TEM system equipped with an alpha-monochromator, described previously. Embodiments of the present disclosure represent a significant improvement with respect to this shared property, being configured to generate a ZLP/1000 width of 80 meV or less, As described in more detail in reference to FIGS. 3A-4F.

Figures 3A, 3B:
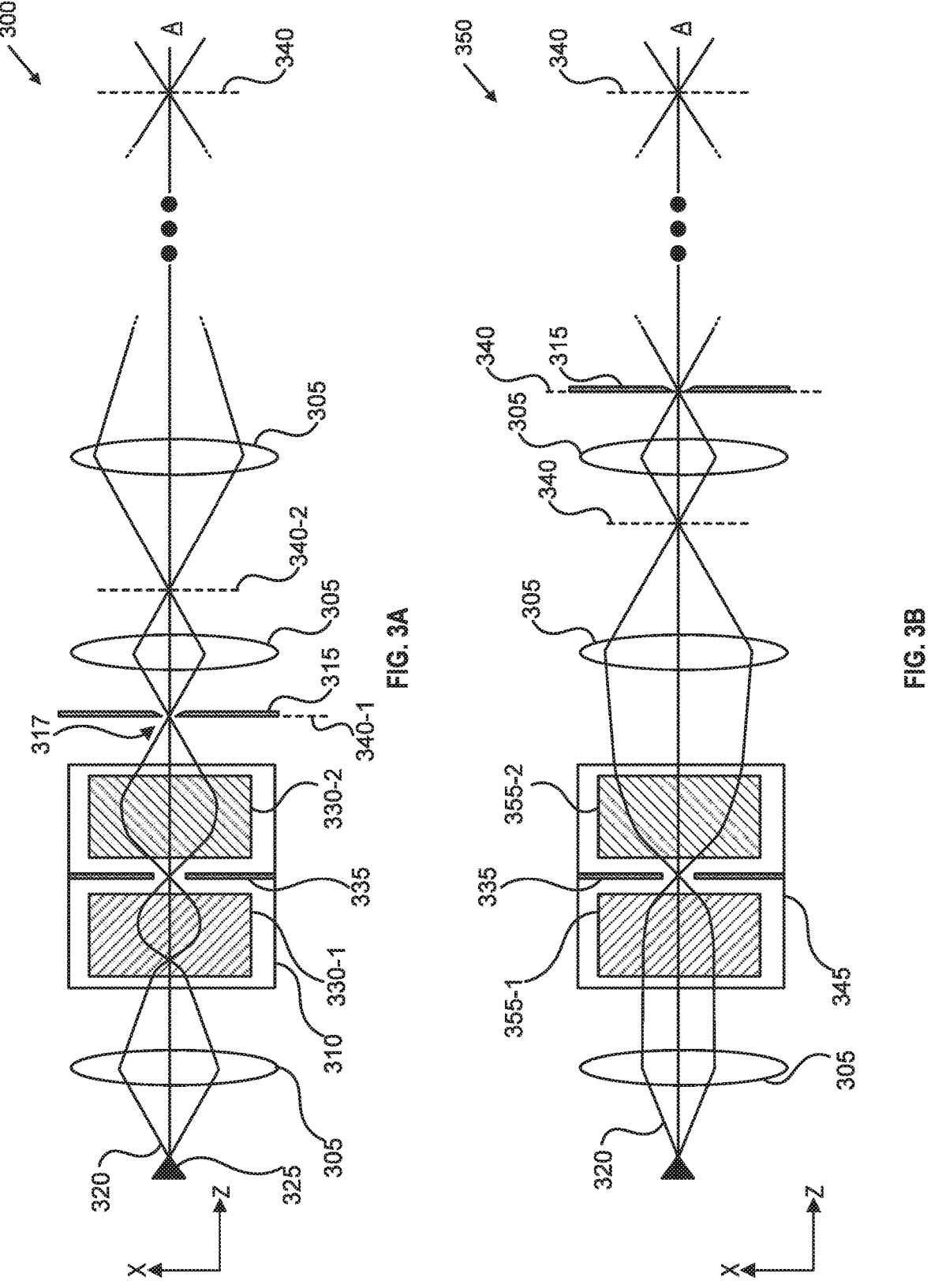
FIG. 3A is a schematic diagram illustrating an example charged particle optical device for a dispersing and fully undispersing monochromator, in accordance with some embodiments of the present disclosure.
FIG. 3B is a schematic diagram illustrating an example charged particle optical device for a dispersing and partly undispersing monochromator, in accordance with some embodiments of the present disclosure.

FIG. 3A is a schematic diagram illustrating an example charged particle optical device 300 for a fully undispersing source, in accordance with some embodiments of the present disclosure. FIG. 3A focuses on an electron optical device in the context of an improved TEM system (e.g., TEM system 100 of FIG. 1) for vibrational EELS, but the embodiments described are not intended to limit the scope of the current disclosure, which includes other charged particle systems (e.g., ion-beam systems, dual beam systems, etc.). The example charged particle optical device 300 includes one or more optical elements 305, a monochromator 310, and a cutoff 315, configured to filter and transform a beam of electrons 320 emitted from a source 325. The example charged particle optical device 300 is illustrated in a dispersive plane ("X-Z") that is parallel to a beam axis A and includes charged particle optical components in an example of the charged particle optical device 115 of FIG. 1. The beam of electrons 320 is shown as axial rays to illustrate the focusing/defocusing effect of the components of example device 300. As such, the axial rays of the beam of electrons 320 denote an axial beam envelope for a nominal energy U, omitting beams with energy U+/−dU, previously shown in FIG. 2A. FIG. 3A is not shown to scale, but rather is shown schematically to represent relative positions of the constituent components of example charged particle device 300. The axial rays illustrated in FIGS. 3A-3C can be anti-symmetrical in the plane 335, also referred to as the "selection plane," but can also lack mirror symmetry in plane 335 (e.g., as in FIG. 4B, FIG. 4D, and FIG. 4F). In this context, "anti-symmetry" refers to a shape of the beam in the selection plane that satisfies the condition x(−z)=−x(2). It is understood that in FIGS. 3A-3D one or more elements of the charged particle optical devices can be repositioned, reordered, and/or omitted. In reference to the forthcoming figures, charged particle optical devices are illustrated using beam-path diagrams including a selection plane (corresponding to slit 335 of FIG. 3A) within a monochromator. It is contemplated that the monochromators can be mirror-symmetric about the selection plane(s), asymmetric, and/or anti-symmetric about the selection plane.

The optical elements 305 represent electromagnetic and/or electrostatic elements configured to shape, form, focus, defocus, accelerate, decelerate, or otherwise transform the beam of electrons 320. In this way, an optical element 305 can be or include a magnetic round lens, a hexapole lens, an octupole lens, an accelerator, a decelerator, or the like. The monochromator 310 of example device 300 includes a double-Wien filter provided with two full-pi or fractional-pi focusing Wien filters 330. As shown, the monochromator 310 is disposed on the beam axis A downstream of an optical element 305 that is configured to focus the beam of electrons 320 onto the beam axis A. In this way, a first Wien filter 330-1 of the double-Wien filter is configured to receive a converging beam and to disperse the energetic components of incident beam in the X-Z plane. A selector 335 is disposed between the first Wien filter 330-1 and a second Wien filter 330-2. The selector 335 defines a slit or aperture that can be positioned and/or repositioned along the X axis at the focal point between the two Wien filters 330 as part of selecting a target energy "U" of the beam of electrons 320 downstream of the monochromator 310. Advantageously, the optical device 300 is configured to correct for coulombic interactions that occur downstream of the selector 335 by focusing electrons of the target energy "U" onto the beam axis A and disposing the cutoff 315 at the corresponding crossover plane 340, thereby blocking electrons deviating from the target energy (e.g., "U+ΔU"), which are either overfocused or underfocused by the monochromator 310 and/or optical element(s) 305 upstream of the cutoff 315 on the beam axis A.

In the context of the present disclosure, the crossover plane 340 is conjugate to the virtual source plane (e.g., a plane of the apparent source size, as seen from below the extractor, where the extractor is a component of the source 325). In some cases, the axial beam is characterized by a line focus (e.g., as opposed to a point focus) in one or both selector planes. In the dispersive plane, defined as the XZ-plane in FIG. 3A, an axial ray $x_a(z)=0$ at the virtual source plane and $x_a(z)=0$ at each cross-over plane 340, and cutoff(s) 315 can be placed at or close to crossover planes 340. In an orthogonal YZ-plane, $y_a(z)=0$ in the virtual source plane, and $y_a(z)$ can also equal zero whenever $x_a(z)=0$ (e.g., in the case of round electron optics), but can also be nonzero, as when the beam is characterized by at least one line focus in the two cutoff planes 340 (e.g., as illustrated in FIG. 4B). The first crossover plane can refer to an image plane of the source in a case of a point focused beam. The crossover plane can refer to a plane that carries the line-focus in the non-dispersive direction (e.g., the Y-direction) in the case of a line focused beam.

The monochromator 310 of example device 300 is configured as a dispersing and fully-undispersing monochromator. In this way, the second Wien filter 330-2 is configured to undisperse the beam of electrons 320 in the X-Z plane and to focus the beam of electrons 320 onto a crossover plane 340 positioned on the beam axis A some distance downstream of the monochromator 310. In the context of the dispersing and undispersing elements of the present disclosure (e.g., Wien filters 330), a dispersing element increases a spatial separation of electrons in a direction transverse to the beam axis A (e.g., the X axis) based at least in part on electron energy (e.g., as expressed by a function of electron velocity), and an undispersing element decreases the spatial separation of electrons in the direction transverse to the beam axis.

In example device 300, the cutoff 315 is disposed on the beam axis A at the position of a first crossover plane 340-1 after the monochromator 310. In some embodiments, the cutoff 315 is disposed on the beam axis A or off-axis relative to the beam axis A at a position of a second crossover plane 340-2 farther from the monochromator 310 than the first crossover plane 340-1. In some embodiments, optical device 300 is configured with the cutoff 315 positioned at the second crossover plane 340-2 and an optical element 305 downstream of the monochromator 310 is configured as a charged particle accelerator (e.g., an electrostatic accelerator).

The cutoff 315 can include a material that absorbs or otherwise impedes the passage of electrons of the beam of electrons 320 having an energy deviating from the target energy, and further defines an aperture 317 through which electrons having an energy about the target energy can pass. The aperture 317 can be defined by a knife edge, a double knife edge, a slit, a circular aperture, a slot aperture, or other geometries permitting the cutoff 315 to selectively block electrons. As described in more detail in reference to FIGS. 4A-4F, the aperture 317 can be characterized by a width (e.g., width 435 of FIG. 4D). In some embodiments, the width of the aperture 317 and/or the position of the aperture can be modified (e.g., autonomously and/or following human interaction with one or more control systems operably coupled with the example device 300). Similarly, operating parameter(s) of one or more components of the example optical device 300 can be modified to vary the spatial-energy distribution along the X axis at the crossover plane 340 at which the cutoff 315 is disposed. In this way, the example optical device 300 can be configured to block electrons that deviate from the target energy by a margin exceeding a given threshold (e.g., ΔU of about 80 meV or greater). In this way, the example devices of FIGS. 3A-3D can narrow the width of the ZLP at the 1/1000 limit to about 80 meV or less, such as 70 meV, 60 meV, 50 meV, 40 meV, 30 meV, 20 meV, or less, including fractions and interpolations thereof, representing a significant improvement in ZLP width over the corresponding performance of monochromators of the current art.

FIG. 3A illustrates a converging beam of electrons 320 at the outlet of the monochromator 310. In some embodiments, the beam of electrons is strongly converging, slightly converging, parallel, slightly diverging, or strongly diverging at the outlet of the monochromator 310. As such, the position of the cutoff 315 can be based at least in part on the configuration of the monochromator 310. In the context of converging axial beams, the term "strongly" is used to refer to an distance between a monochromator exit plane and the crossover plane 340 of less than about 5 cm (e.g., from about 1 cm to about 3 cm). In this context, the term "slightly" is used to refer to a distance between the monochromator exit plane and the crossover plane 340 of more than about 5 cm (e.g., about 5 cm to about 10 cm)

FIG. 3B is a schematic diagram illustrating an example charged particle optical device 350 including a dispersing and partly undispersing monochromator 345, in accordance with some embodiments of the present disclosure. In contrast to the example device 300 of FIG. 3A, the example device 350 of FIG. 3B includes the partly undispersing monochromator 345 that is configured to receive a parallel beam of electrons 320, a diverging beam of electrons 320, and/or a converging beam of electrons 320. In this context, "partly undispersing" refers to an electron beam being undispersed at crossover planes 340 and being dispersed away from crossover planes 340. The monochromator 310 of example device 300 is configured to receive a parallel beam of electrons 320, a slightly diverging beam of electrons 320, and/or a converging beam of electrons 320. The monochromator 345 of example device 350 includes a double Wien filter, configured to select a subset of electrons in the beam of electrons 320 having an energy substantially equal to the target energy "U" using a first half-pi Wien filter 355-1, a second half-pi Wien filter 355-2, and a selector 335 disposed between the first half-pi Wien filter 355-1 and the second half-pi Wien filter 355-2. Further, the monochromator 345 of example device 350 outputs a dispersed beam for which the dispersion vanishes or appreciably vanishes at the crossover point(s) 340 (e.g., the first crossover point 340-1 after the monochromator 345), while exhibiting angular dispersion at crossover point(s) 340. This is in contrast to the monochromator 310 of example device 300 that is "fully undispersing," describing a monochromator that outputs an undispersed beam.

Positioning the cutoff 315 at a crossover point 340, where the beam of electrons 320 is undispersed for the example device 350, improves performance of the monochromator 345 for vibrational EELS at least in part because the cutoff 315 does not block electrons at the target energy. The monochromator 345 can be configured to filter the beam of electrons 320 to select a subset of electrons having energy about the target energy. Whereas coulombic interactions can induce a broadening of the energy distribution in the beam of electrons 320 downstream of the monochromator 345, which widens the ZLP, positioning the cutoff 315 at a crossover plane 340 can block electrons having an energy deviating from the target energy by a differential energy equal to or exceeding a threshold value. As illustrated for the example device 350, an optical element 305 can be disposed on the beam axis A to focus the beam of electrons 320 onto the beam axis A, which can include an accelerator or other element configured to focus electrons having about the target energy onto the crossover plane 340 and to send electrons deviating from the target energy into the material of the cutoff 315.

Figures 3C, 3D:
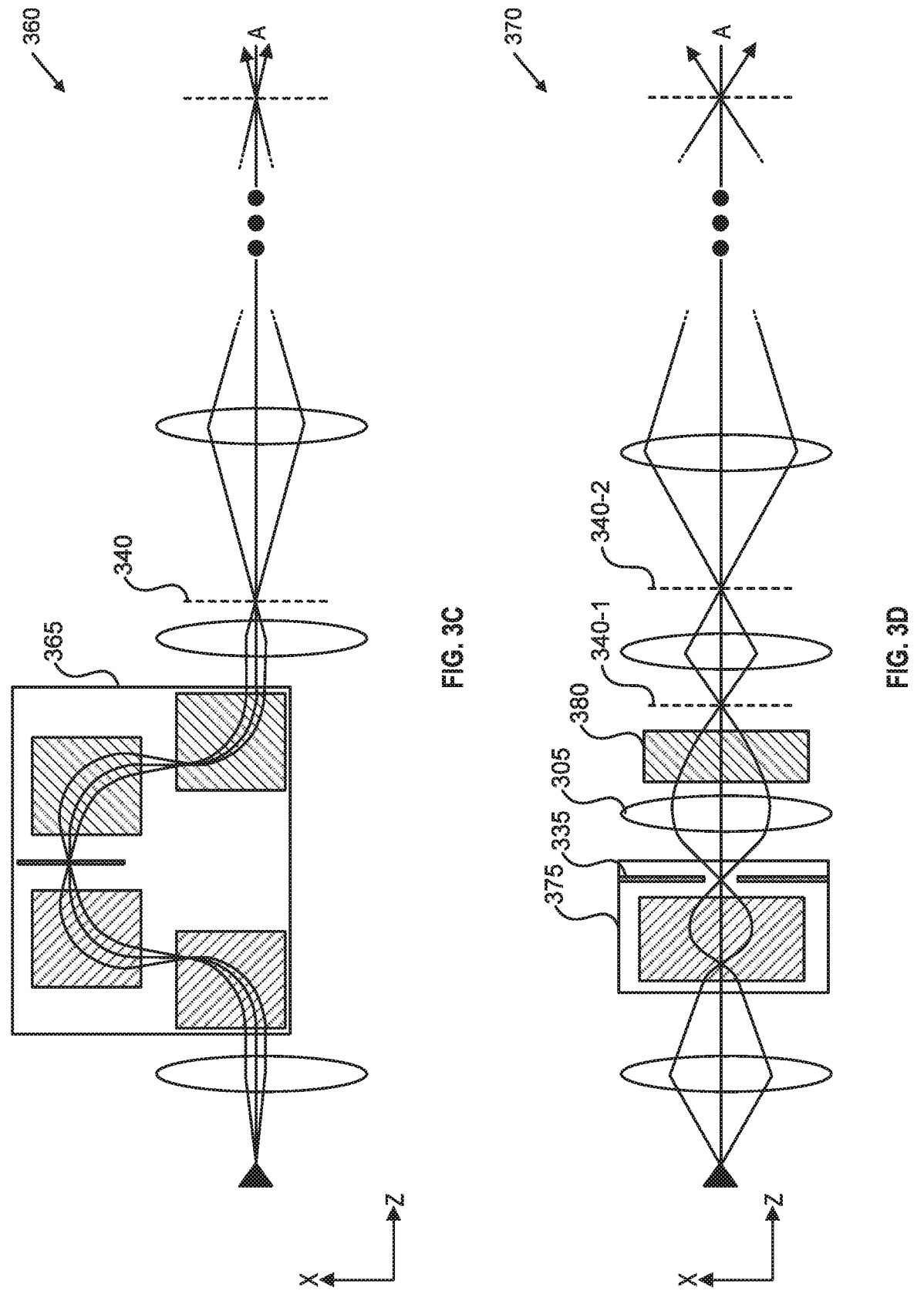
FIG. 3C is a schematic diagram illustrating an example charged particle optical device for a curved-axis monochromator, in accordance with some embodiments of the present disclosure.
FIG. 3D is a schematic diagram illustrating an example charged particle optical device for a dispersing monochromator, in accordance with some embodiments of the present disclosure.

FIG. 3C is a schematic diagram illustrating an example charged particle optical device 360 for a curved-axis monochromator, in accordance with some embodiments of the present disclosure. Example device 360, similar to example device 300 of FIG. 3A, is a fully-undispersing configuration that includes an omega ("Ω")-type monochromator 365 for which the beam axis A is curved by the action of dispersing and undispersing elements included in the Ω-type monochromator 365. The Ω-type monochromator 365 can be configured as a focusing monochromator that generates an output beam converging onto the beam axis A. In some embodiments, the Ω-type monochromator 365 can be configured to generate an output beam that is diverging or parallel, relative to the beam axis A. Other examples of monochromators exhibiting a curved or redirected beam axis A include, but are not limited to, mirror monochromators, alpha-type monochromators, Mandoline configurations, and W-type configurations. In some embodiments, the cutoff 315 can be disposed on a crossover plane 340 downstream of one or more optical elements 305, as shown, or, as in the case of a focusing monochromator, downstream of the monochromator before the optical element(s) 305.

FIG. 3D is a schematic diagram illustrating an example charged particle optical device 370 for a dispersing monochromator 375, in accordance with some embodiments of the present disclosure. As described in more detail in reference to FIG. 2A, the dispersing monochromator 375 includes a single Wien filter that is configured to output a dispersing beam of electrons 320. To that end, the example device 370 includes one or more optical elements 305 and an undispersing element 380 downstream of the dispersing monochromator 375, downstream of which the first crossover point 340-1 forms. In some embodiments, the one or more optical elements 305 upstream of the undispersing element 380 include an accelerator. In contrast to FIG. 2A, however, the accelerator of example device 370 is disposed downstream of the selector 335, and the undispersing element 380 is absent from the monochromated source of FIG. 2A. The undispersing element 380 can be relatively weak, as compared to the full-pi 330 or half-pi filters 355 of FIGS. 3A-3C. In this context, "relatively weak" is used to refer to an undispersing element that does not fully undisperse the beam of electrons 320. Even so, disposing the cutoff 315 at a crossover plane 340 can effectively narrow the width of the ZLP at the $\frac{1}{1000}$ limit, making example device 370 a suitable configuration for vibrational EELS, and improved relative to existing sources such as the alpha-type configuration or the monochromated source of FIG. 2A.

Figure 4A:
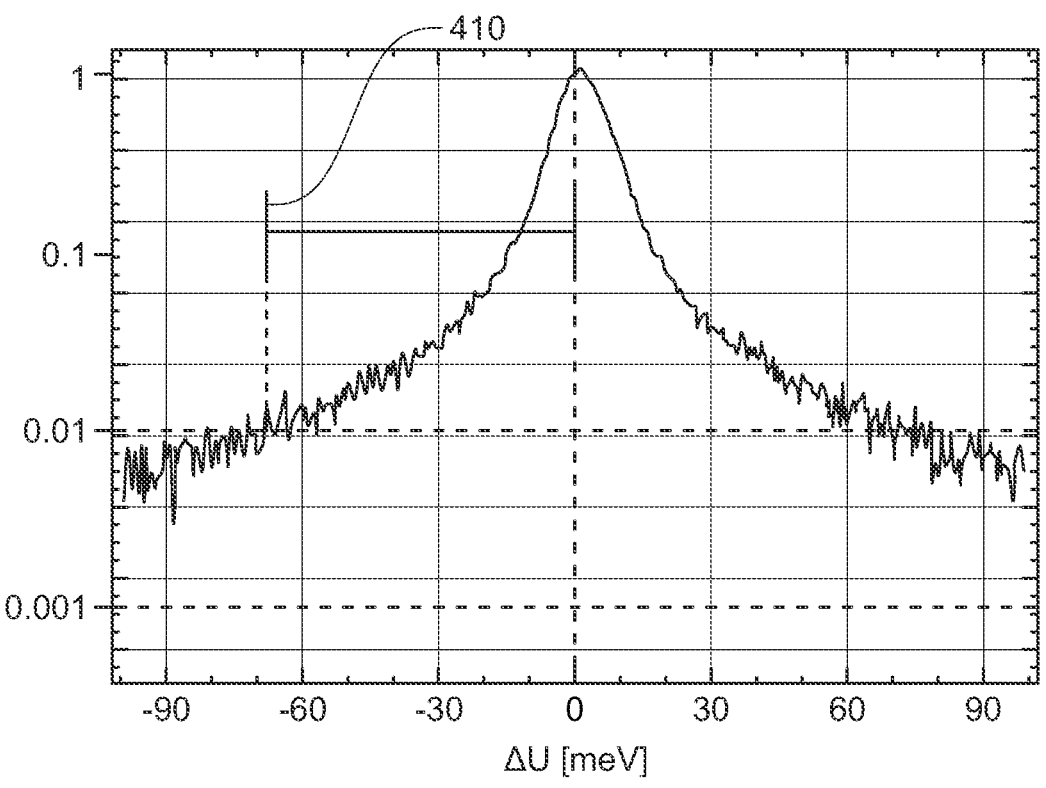
FIG. 4A is an example zero-loss peak graph simulated for the electron source of FIG. 3A using an aperture width much wider than the input beam width, in accordance with some embodiments of the present disclosure.
Figure 4B:
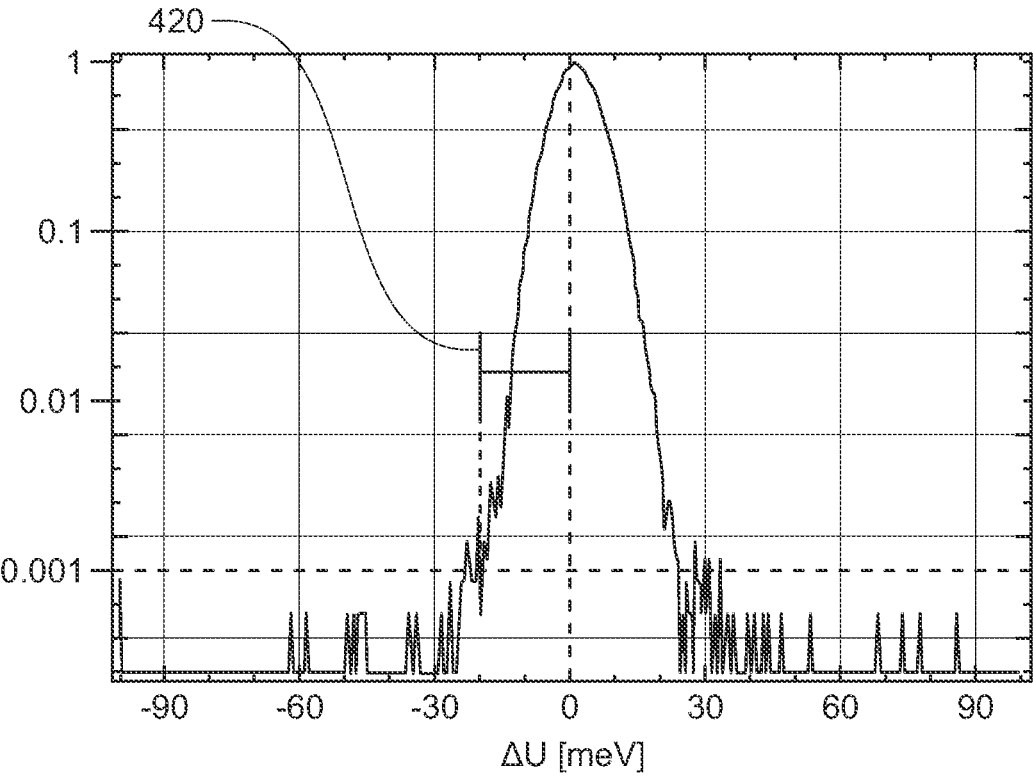
FIG. 4B is an example zero-loss peak graph simulated for the electron source of FIG. 3A using an aperture width slightly wider than the input beam width, in accordance with some embodiments of the present disclosure.
Figure 4C:
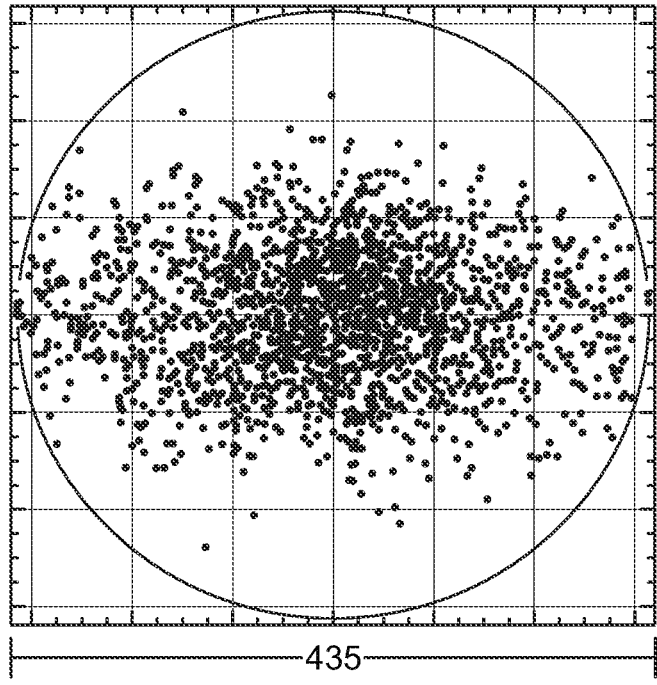
FIG. 4C is an example beam spread diagram simulated for the electron source of FIG. 3A using an aperture width slightly wider than the input beam width, in accordance with some embodiments of the present disclosure.
Figure 4D:
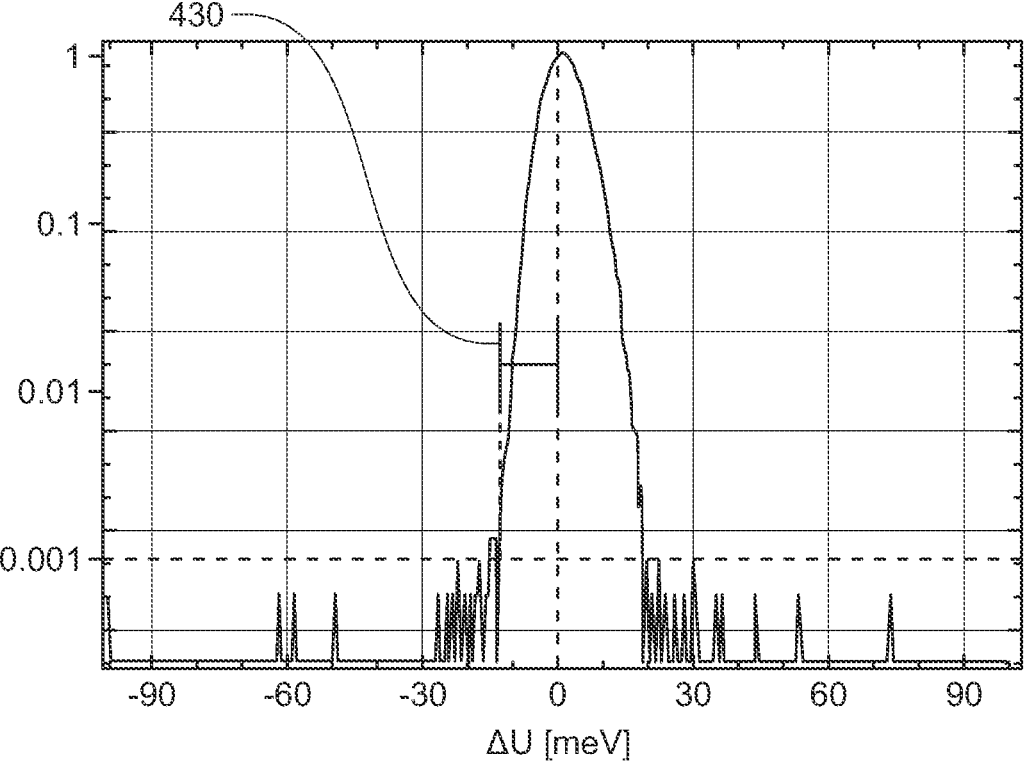
FIG. 4D is an example zero-loss peak graph simulated for the electron source of FIG. 3A using an aperture width approximating the input beam width, in accordance with some embodiments of the present disclosure.
Figure 4E:
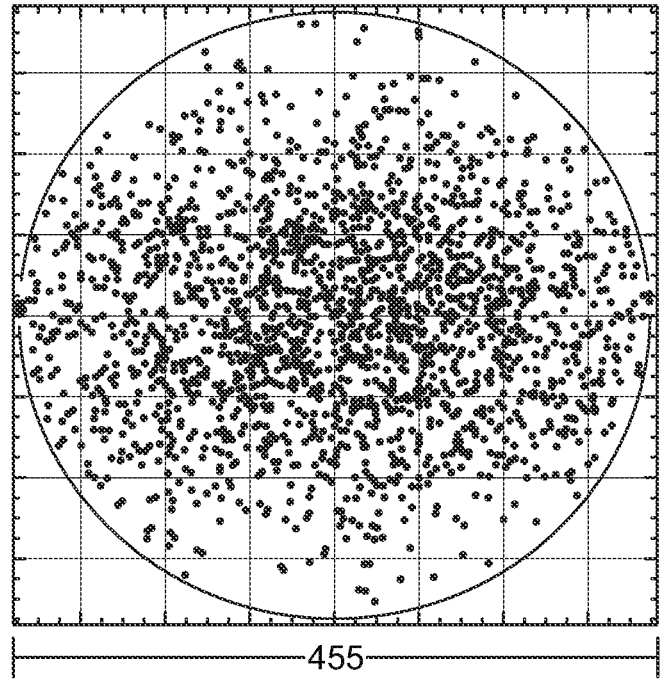
FIG. 4E is an example beam spread diagram simulated for the electron source of FIG. 3A using an aperture width approximating the input beam width, in accordance with some embodiments of the present disclosure.

FIGS. 4A-4F illustrate a series of comparative examples developed for the example charged particle optical devices of FIGS. 3A-3D. The data presented were generated by simulating the constituent components of the devices using Monte Carlo (e.g., stochastic) simulation methods that include physical models for coulombic interaction. The examples presented are demonstrative of a typical TEM system (e.g., TEM system 100 of FIG. 1) configured for application in EELS. As such, the simulations correspond to a TEM system configured to generate a monochromated beam of electrons characterized by a FWHM of about 5 meV to about 30 meV and a beam current of about 10 pA to about 200 pA, for which the operating parameters of the TEM system are kept consistent across the various examples (e.g., for an accelerating voltage from about 30 kV to about 300 kV). FIGS. 4A-4B correspond to an optical device omitting a cutoff, as in the current art. FIGS. 4C-4F correspond to an optical device including cutoffs of different widths to illustrate the influence of aperture size (e.g., aperture 317 of FIG. 3A) on ZLP width at the $\frac{1}{1000}$ limit. In FIG. 4A, FIG. 4C, and FIG. 4E, the graphs plot normalized intensity vs. differential energy as in FIG. 2B. In FIG. 4B, FIG. 4D, and FIG. 4F, the graphs plot a spatial distribution of electrons analogous to a view of the beam of electrons 320 in a plane transverse to the beam axis A (e.g., "X-Y"). As such, the axes of FIG. 4B, FIG. 4D, and FIG. 4F, represent position in the X-axis and Y-axis, with the beam axis A substantially centered in the graphs.

FIG. 4A is an example zero-loss peak ZLP graph simulated for the electron source of FIG. 3A that omits the cutoff 315 or includes the cutoff 315 using an aperture 317 width much wider than the width of the beam of electrons 320 at the entrance to the example device 300 (referred to as the input beam width), in accordance with some embodiments of the present disclosure. The FWHM of the ZLP in FIG. 4A was determined to be about 12 meV for a monochromated probe current of 125 pA, the half width 410 at ZLP/100 was determined to be about 70 meV, but the ZLP did not reach the $\frac{1}{1000}$ limit (e.g., ZLP/1000) within a range of differential energy that is meaningful for vibrational EELS. The graph of FIG. A is presented as a comparative example, to emphasize the improvement in energy resolution of the ZLP that is afforded by including the cutoff (e.g., cutoff 315 of FIG. 3A), as compared to fully undispersing monochromators that do not attenuate coulombic interactions downstream.

FIG. 4B is an example zero-loss peak graph simulated for the electron source of FIG. 3A using an aperture width slightly wider than the input beam width, in accordance with some embodiments of the present disclosure. The FWHM of the ZLP in FIG. 4C was determined to be about 11.5 meV, substantially unchanged from the ZLP FWHM in FIG. 4A, with a monochromated probe current of about 90 pA (about a 30% decrease in probe current). The width 420 at ZLP/1000 was determined to be about 20 meV, indicating that the example device outputs a beam within a ZLP width at the $\frac{1}{1000}$ limit that is suitable for vibrational EELS, and is significantly improved relative to the current benchmark for monochromated sources. The graph of FIG. 4C indicates a significant improvement in energy resolution of the ZLP that is afforded by including a cutoff (e.g., cutoff 315 of FIG. 3A) at a crossover point downstream of the monochromator.

FIG. 4C is an example beam spread diagram simulated for the electron source of FIG. 3A using an aperture width slightly wider than the input beam width, in accordance with some embodiments of the present disclosure. The spatial distribution in the X-Z plane, visualized in the graph of FIG. 4D. In comparison to the graphs of FIG. 4D and FIG. 4F, a width of the aperture 317 of about 1 μm or less (e.g., about 500 nm) can reduce the width 425 of the beam of electrons in space and produce a reduction in width of the ZLP at the $\frac{1}{1000}$ limit in energy space. In FIG. 4D, where the width 425 is wider than the width of the beam generated by the electron source 325, an asymmetric distribution about the X-axis in FIG. 4D is visible. This is attributable to the action of the monochromator 310 being restricted to the X-Z plane. In some embodiments, monochromator 310 is symmetric about the beam axis A, such that the distribution is less grouped about the X-axis.

FIG. 4D is an example zero-loss peak graph simulated for the electron source of FIG. 3A using an aperture width approximating the input beam width, in accordance with some embodiments of the present disclosure. The FWHM of the ZLP in FIG. 4E was determined to be about 10 meV, substantially unchanged from the ZLP FWHM in FIG. 4A, with a monochromated probe current of about 72 pA (about a 60% decrease in probe current). The width 430 at ZLP/1000 was determined to be about 15 meV, indicating that the example device outputs a beam within a ZLP width at the $\frac{1}{1000}$ limit that is suitable for vibrational EELS, and is significantly improved relative to the current benchmark for monochromated sources. Further, the beam can be characterized by a monochromated probe current between about 10 pA and about 100 pA, which is suitable for vibrational EELS. The graph of FIG. 4E indicates a significant improvement in energy resolution of the ZLP that is afforded by including a cutoff (e.g., cutoff 315 of FIG. 3A) at a crossover point downstream of the monochromator.

FIG. 4E is an example beam spread diagram simulated for the electron source section and monochromator optics of FIG. 3A using an aperture 317 width approximating the input beam width, in accordance with some embodiments of the present disclosure. In comparison to the graphs of FIG. 4B and FIG. 4D, a width of the aperture 317 approximating the width of the beam at the source 325 (e.g., about 300-1000 nm) can reduce the width 425 of the beam of electrons in space and produce a reduction in width of the ZLP at the $\frac{1}{1000}$ limit in energy space. Advantageously, without magnifying or demagnifying optics, alpha-type monochromators typically require an input source width on the order of 10 nm (e.g., 10 nm-40 nm), implicating a reduced probe current and relatively complex beam forming optics upstream of the monochromator. Reducing the width of the aperture 317 can improve the width of the ZLP at the $\frac{1}{1000}$ limit, but for electron energies in the range 30 to 300 keV, a practical lower limit for the size of aperture 317 can be about 500 nm. In addition, the configuration described in FIGS. 4E-4F reduce the spatial tails of the beam of electrons. For example, the spatial tails in a STEM probe can be removed. In Momentum Resolved EELS, a.k.a. Angular resolved EELS, the momentum resolution can be similarly improved, such that with a reduced aperture size, the aperture intercepts electrons deviating from the target energy and/or deviating from the beam axis in the aperture plane.

Figure 5:
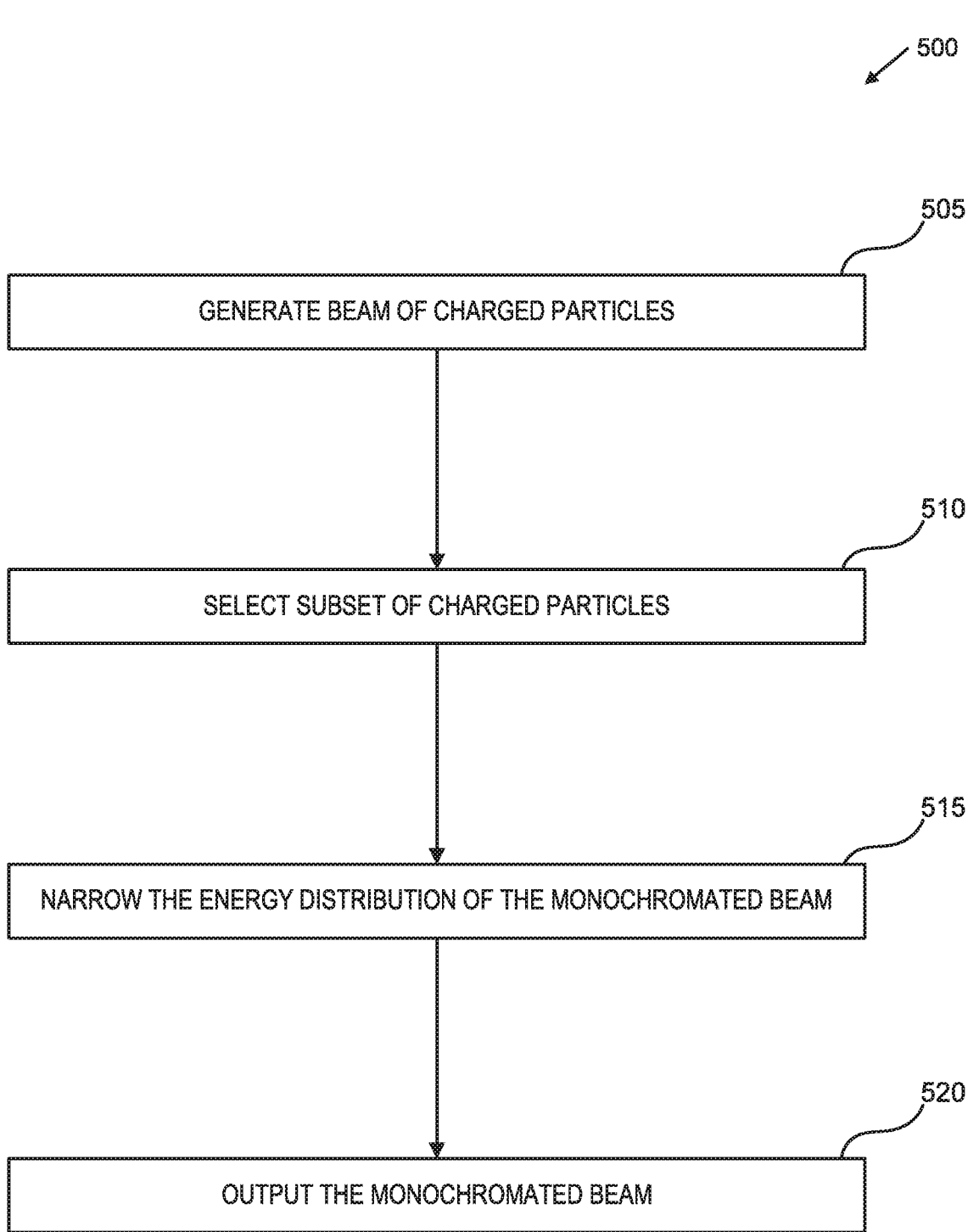
FIG. 5 is a block flow diagram for an example process for generating a monochromated beam of charged particles, in accordance with some embodiments of the present disclosure.

FIG. 5 is a block flow diagram of an example process 500 for generating a monochromated beam of charged particles, in accordance with some embodiments of the present disclosure. As described in reference to FIGS. 1-4F, one or more operations making up the example process 500 can be executed by a computer system operably coupled with components of a charged particle microscope (e.g., TEM system 100 of FIG. 1) and/or additional systems or subsystems including, but not limited to, characterization systems, network infrastructure, databases, and user interface devices. To that end, operations can be stored as machine executable instructions in one or more machine readable media.

Operations of the example process 500 can be repeated, reordered, and/or omitted, for example, as part of performing a vibrational EELS workflow. To that end, the operations of example process 500 are described as being performed by a system, where it is understood that the operations can include generating and communicating control signals between a processor or other logic circuit and electronic or electromechanical elements of the charged particle microscope. The operations of example process 500 are described in the context of an electron microscope in the interest of clarity. Embodiments of the present disclosure include processes for generating chromatic ion beams, as well as other charged particle configurations, such as dual beam systems.

Example process 500 includes generating a beam of charged particles at operation 505. The beam of electrons 320 of FIGS. 3A-3D is an example of the beam of charged particles of operation 505. Generating the beam of charged particles can include energizing an emitter source (e.g., source 325 of FIG. 3A) by modulating a high voltage supply coupled with the emitter source. As would be understood by a person of ordinary skill in the art, operation 505 can be preceded by one or more operations and/or sub-operations, such as evacuating the environment surrounding the source down a high vacuum or ultrahigh vacuum or completing an internal calibration test, cleaning cycle, or other processes that form part of the operation of charged particle microscopy systems. To that end, in some embodiments of example process 500, for example, where an electron microscope switches from one operative mode (e.g., TEM imaging mode) to another (e.g., spot-mode EELS), generating the beam of charged particles can refer to modifying the operation of the source (e.g., via one or more control instructions executed by the computer system) to facilitate microanalysis, such as vibrational EELS.

Example process 500 includes selecting a subset of charged particles of the beam of charged particles including a monochromated beam at operation 510. As described in more detail in reference to FIG. 2A and FIGS. 3A-4F, monochromators can be included as part of charged particle optical devices (e.g., electron optical device 115 of FIG. 1) to selectively filter, block, or otherwise remove regions of the energy distribution from the charged particles emitted from the source (e.g., using the double Wien filter of monochromator 310 of FIG. 3A). As the monochromator limits the beam current available for imaging and microanalysis, some charged particle systems can selectively activate the charged particle optical devices of the present disclosure as part of performing loss spectroscopy. Selecting the subset of electrons generates a monochromated beam having an energy distribution about a target energy "U." In some embodiments, the target energy can be determined based at least in part on the composition of a sample to be analyzed. For example, the target energy can be determined by performance characteristics of the charged particle microscope components, but one or more parameters of the charged particle optical devices of the present disclosure can be modified to change the target energy (e.g., by translating selector 335 of FIG. 3A along the X-axis) to better interrogate electronic transitions of the sample material.

Example process 500 includes narrowing the energy distribution of the monochromated beam at operation 515. In some embodiments, narrowing the energy distribution includes selectively blocking, redirecting, absorbing, or otherwise attenuating charged particles downstream of the monochromator that deviate from the target energy (e.g., as a result of coulombic interactions in the case of electrons). As described in more detail in reference to FIGS. 3A-4F, a cutoff (e.g., cutoff 315 of FIG. 3A) can be disposed on a beam axis (e.g., beam axis A of FIG. 3A) of the charged particle optical devices of the present disclosure. The cutoff can be disposed at a position on the beam axis corresponding with a crossover plane of the beam of charged particles (e.g., crossover plane 340 of FIG. 3A), in an approach to spatially restricting the width of the charged particle energy distribution, as described in more detail in reference to FIGS. 4A-4F.

Example process 500 includes outputting the monochromated beam at operation 520. Sub-operations of operation 520 can include forming, shaping, redirecting, or otherwise transforming the monochromated beam via one or more charged particle optics (e.g., optical element(s) 305 of FIGS. 3A-3D). In an illustrative example, operation 520 can include coupling a chromatic electron beam into a TEM column section that includes diverse electron optical lenses and apertures to condition the beam for spot-mode EELS microanalysis of a sample held in the objective section.

In the preceding description, various embodiments have been described. For purposes of explanation, specific configurations and details have been set forth in order to provide a thorough understanding of the embodiments. However, it will also be apparent to one skilled in the art that the embodiments may be practiced without the specific details. Furthermore, well-known features may have been omitted or simplified in order not to obscure the embodiment being described. While example embodiments described herein center on electron microscopy systems, and TEM systems in particular, these are meant as non-limiting, illustrative embodiments. Embodiments of the present disclosure are not limited to such embodiments, but rather are intended to address charged particle beam systems for which a wide array of particles can be applied to imaging, microanalysis, and/or processing of materials on an atomic scale. Such particles may include, but are not limited to, electrons or ions in TEM systems, SEM systems, STEM systems, ion beam systems, multi-beam systems, and/or particle accelerator systems.

Some embodiments of the present disclosure include a system including one or more data processors and/or logic circuits. In some embodiments, the system includes a non-transitory computer readable storage medium containing instructions which, when executed on the one or more data processors, cause the one or more data processors to perform part or all of one or more methods and/or part or all of one or more processes and workflows disclosed herein. Some embodiments of the present disclosure include a computer-program product tangibly embodied in a non-transitory machine-readable storage medium, including instructions configured to cause one or more data processors and/or logic circuits to perform part or all of one or more methods and/or part or all of one or more processes disclosed herein.

The terms and expressions which have been employed are used as terms of description and not of limitation, and there is no intention in the use of such terms and expressions of excluding any equivalents of the features shown and described or portions thereof, but it is recognized that various modifications are possible within the scope of the claims. Thus, it should be understood that although the present disclosure includes specific embodiments and optional features, modification and variation of the concepts herein disclosed may be resorted to by those skilled in the art, and that such modifications and variations are considered to be within the scope of the appended claims.

Where terms are used without explicit definition, it is understood that the ordinary meaning of the word is intended, unless a term carries a special and/or specific meaning in the field of charged particle microscopy systems or other relevant fields. The terms "about" or "substantially" are used to indicate a deviation from the stated property within which the deviation has little to no influence of the corresponding function, property, or attribute of the structure being described. In an illustrated example, where a dimensional parameter is described as "substantially equal" to another dimensional parameter, the term "substantially" is intended to reflect that the two parameters being compared can be unequal within a tolerable limit, such as a fabrication tolerance or a confidence interval inherent to the operation of the system. Similarly, where a geometric parameter, such as an alignment or angular orientation, is described as "about" normal, "substantially" normal, or "substantially" parallel, the terms "about" or "substantially" are intended to reflect that the alignment or angular orientation can be different from the exact stated condition (e.g., not exactly normal) within a tolerable limit. In an example, optical components of the monochromated electron sources (e.g., cutoff 315 of FIG. 3A) can can be "substantially aligned" with the beam axis (e.g., beam axis A of FIG. 3A), which can include a deviation from exact alignment resulting from physical phenomena affecting the position of the beam in space (e.g., beam drift). For dimensional values, such as diameters, lengths, widths, or the like, the term "about" can be understood to describe a deviation from the stated value of up to +10%. For example, a dimension of "about 10 mm" can describe a dimension from 9 mm to 11 mm.

The description provides exemplary embodiments, and is not intended to limit the scope, applicability or configuration of the disclosure. Rather, the ensuing description of the exemplary embodiments will provide those skilled in the art with an enabling description for implementing various embodiments. It is understood that various changes may be made in the function and arrangement of elements without departing from the spirit and scope as set forth in the appended claims. Specific details are given in the description to provide a thorough understanding of the embodiments. However, it will be understood that the embodiments may be practiced without these specific details. For example, specific system components, systems, processes, and other elements of the present disclosure may be shown in schematic diagram form or omitted from illustrations in order not to obscure the embodiments in unnecessary detail. In other instances, well-known circuits . . . processes, components, structures, and/or techniques may be shown without unnecessary detail.

What is claimed is:

1. A charged particle optical device, comprising:
a dispersing element disposed on a beam axis, the dispersing element being configured to disperse particles of a beam of charged particles by energy in a dispersal plane parallel with the beam axis;
a selector, disposed on the beam axis at a position substantially corresponding to a first crossover plane;
an undispersing element, wherein the undispersing element is configured to at least partially undisperse particles of the beam of charged particles by energy in the dispersal plane; and
a cutoff disposed on the beam axis downstream of the selector at a position substantially corresponding to a second crossover plane on the beam axis, the second crossover plane being downstream of the first crossover plane, the cutoff comprising a material that is opaque to electrons and defining an aperture substantially aligned with the beam axis.

2. The charged particle optical device of claim 1, being configured to output a beam of charged particles having an energy deviation from a target energy of less than or equal to about 80 meV at the ¹⁄₁₀₀₀ limit, wherein the ¹⁄₁₀₀₀ limit corresponds to a value of the energy distribution of the beam of electrons that is 1000 times smaller than a peak of the energy distribution at the target energy.

3. The charged particle optical device of claim 1, wherein the aperture is characterized by a width of about 200 nm to about 700 nm in a direction transverse to the beam axis at the crossover point.

4. The charged particle optical device of claim 1, wherein a plurality of crossover planes are defined on the beam axis downstream of the undispersing element, and wherein the second crossover is nearest to the undispersing element of the plurality of crossover planes.

5. The charged particle optical device of claim 1, wherein a third crossover plane is defined on the beam axis between the undispersing element and the second crossover plane.

6. The charged particle optical device of claim 1, wherein the beam of electrons is a line focused beam.

7. The charged particle optical device of claim 1, wherein the dispersing element comprises a first Wien filter, the undispersing element comprises a second Wien filter downstream of the first Wien filter, and the selector comprises a slit disposed on or near the beam axis between the first Wien filter and the second Wien filter.

8. The charged particle optical device of claim 7, wherein the first Wien filter is a Pi dispersing element and the second Wien filter is a Pi undispersing element.

9. The charged particle optical device of claim 7, wherein the first Wien filter is a half-Pi dispersing element and the second Wien filter is a half-Pi undispersing element.

10. The charged particle optical device of claim 1, wherein the dispersing element, the selector, and the undispersing element together form at least a part of a fully undispersing monochromator.

11. The charged particle optical device of claim 10, wherein the beam axis is curved within the monochromator.

12. The charged particle optical device of claim 10, wherein the monochromator is a mirror monochromator or an Ω-type monochromator.

13. The charged particle optical device of claim 1, further comprising one or more electron lenses, disposed on the beam axis downstream of the selector and configured to converge the beam of electrons onto the beam axis at the crossover plane, the second crossover plane, or the third crossover plane.

14. The charged particle optical device of claim 13, wherein the one or more lenses comprise an electromagnetic lens or an electrostatic lens.

15. The charged particle optical device of claim 13, further comprising an undispersing element disposed downstream of one or more lenses of the one or more lenses and upstream of the crossover plane.

16. A transmission electron microscope, comprising:
an electron source, configured to generate a beam of electrons aligned along a beam axis;
a monochromator disposed on a beam axis, the monochromator comprising:
a dispersing element disposed on a beam axis, the dispersing element being configured to disperse particles of a beam of charged particles by energy in a dispersal plane parallel with the beam axis;
a selector, disposed on the beam axis at a position substantially corresponding to a first crossover plane;
an undispersing element, wherein the undispersing element is configured to at least partially undisperse particles of the beam of charged particles by energy in the dispersal plane; and
a cutoff disposed on the beam axis downstream of the undispersing element at a position substantially corresponding to a second crossover plane on the beam axis, the cutoff comprising a material that is opaque to electrons and defining an aperture aligned with the beam axis.

17. The transmission electron microscope of claim 16, wherein the charged particle optical device is configured to output a beam of electrons having an energy deviation from a target energy of less than or equal to about 80 meV at the $\frac{1}{1000}$ limit.

18. The transmission electron microscope of claim 16, further comprising an electron optical element disposed on the beam axis between the electron source and the monochromator.

19. The transmission electron microscope of claim 18, wherein the electron optical element is configured to focus the beam toward the beam axis, and wherein the monochromator and the undispersing element together form at least part of a fully undispersing double-Wien filter.

20. The transmission electron microscope of claim 18, wherein the electron optical element is configured to output a substantially parallel or diverging beam toward the beam axis, and wherein the monochromator and the undispersing element together form at least part of a half-pi-half-pi double-Wien filter.

\* \* \* \* \*